United States Patent
Park

(10) Patent No.: US 7,720,563 B2
(45) Date of Patent: May 18, 2010

(54) STOCKER DRIVING SYSTEM AND STOCKER DRIVING METHOD USING THE SAME

(75) Inventor: Jeong Ho Park, Daegu-si (KR)

(73) Assignee: LG Display Co., Ltd., Seoul (KR)

(*) Notice: Subject to any disclaimer, the term of this patent is extended or adjusted under 35 U.S.C. 154(b) by 715 days.

(21) Appl. No.: 11/169,231

(22) Filed: Jun. 29, 2005

(65) Prior Publication Data

US 2006/0045670 A1 Mar. 2, 2006

(30) Foreign Application Priority Data

Jun. 30, 2004 (KR) .................. 10-2004-0050597

(51) Int. Cl.
*G06F 7/00* (2006.01)
(52) U.S. Cl. ....................... 700/214; 414/940
(58) Field of Classification Search ............ 414/940, 414/217.1; 700/213–214
See application file for complete search history.

(56) References Cited

U.S. PATENT DOCUMENTS 6,129,496 A * 10/2000 Iwasaki et al. ......... 414/222.01

* cited by examiner

*Primary Examiner*—Saúl J Rodríguez
*Assistant Examiner*—Joshua I Rudawitz
(74) *Attorney, Agent, or Firm*—McKenna Long & Aldridge LLP

(57) ABSTRACT

Disclosed is a stocking system that effectively copes with contingencies such as a sudden increase in the number of units to be stocked or malfunctions that render a port disabled. The stocking system includes a plurality of input ports and output ports that are operated automatically, and in input/output port that is normally operated manually, but is configurable to be operated automatically in conjunction with the other input ports and output ports. The stocking system also includes a conversion controller for switching the input/output port between manual and automatic mode.

5 Claims, 4 Drawing Sheets

STOCKER DRIVING SYSTEM AND STOCKER DRIVING METHOD USING THE SAME

This application claims the benefit of Korean Patent Application No. 10-2004-0050597, filed on Jun. 30, 2004, which is hereby incorporated by reference for all purposes as if fully set forth herein.

BACKGROUND OF THE INVENTION

1. Field of the Invention

The present invention relates to a stocking system, and more particularly, to a stocker driving system for effectively handling malfunctions that hamper operation of the stocking system and for coping with sudden increases in demand.

2. Description of the Related Art

Liquid crystal display devices (LCD) have gained in popularity. Having excellent picture quality, lower power consumption, thin profile, and low weight, LCDs have supplanted cathode ray tubes (CRT) for information display purposes. Recent developments in the semiconductor industry have enabled improvements, which have increased demand for LCDs.

LCDs are manufactured in a multi-step process, which includes fabricating an upper substrate and a lower substrate; coating and rubbing an alignment layer on the substrates for aligning a liquid crystal; attaching the upper substrate and the lower substrate; injecting the liquid crystal between the attached upper and lower substrates; and sealing the attached upper and lower substrates. After the alignment layer is coated and rubbed on the substrates, the substrates are attached using a sealant, and liquid crystal material is injected between the substrates through a sealant inlet-hole.

As LCDs are manufactured, it is often necessary to temporarily store partially completed LCDs as they go from one fabrication step to the next. Toward this end, partially completed LCDs are generally stored in a stocking system (hereinafter "stocker"), where they are stored and then transferred using a cassette transfer vehicle (CTV) from the stocker for the next process.

CTVs are classified into rail guided vehicle (RGV), which move along a rail, and automatic guided vehicles (AGV), which move along a designated path using automatic control systems. Recent advances in AGVs include laser guided vehicles (LGV), which are equipped with laser navigation systems has been developed and used.

FIG. 1 is a view illustrating a stocker according to the related art, in which a cassette is transferred through an AGV input/output port of a cassette stocker. A stocker includes a plurality of shelves or racks in which cassettes are stored, and input and output ports through which AGVs insert and retrieve cassettes. A cassette refers to a rack that holds one or more partially completed LCDs. An AGV transports LCDs in cassettes.

Referring to FIG. 1, a cassette containing partially completed LCDs is stored in a stocker 100 after a given fabrication step. At the appropriate time, AGVs retrieve and transfer the cassettes to the next manufacturing step. Based on the arrangement of the LCD manufacture equipment, AGV lines 101a and 101b may be installed at both sides of the stocker 100, on which the AGV may move to transport cassettes.

As illustrated in FIG. 1, stocker 100 includes AGV input ports 103a and 105a, AGV output ports 103b and 105b, corresponding to the AGV lines 101a and 101b.

Accordingly, an AGV moving along the AGV line 101a loads and unloads cassettes respectively through input port 103a and output port 103b. Also, another AGV may move along AGV line 101b and load and unload cassettes respectively through input port 105a and output port 105b.

When an AGV loads cassettes into input port 103a on one side region in the stocker 100, the cassettes are moved to the AGV output port 105b of the other side region.

However, a related art stocker 100 controlled to input/output the cassettes as described above has the following drawbacks. First, a pair of AGV input/output ports is installed at one side of the stocker corresponding to the AGV line. When many cassettes are suddenly input/output in the LCD manufacture process, the pair of AGV input/output ports cannot appropriately process the sudden increase in cassettes, resulting in a bottleneck. Second, if an AGV input/output port is disabled due to a malfunction, the entire stocker 100 is shut down.

SUMMARY OF THE INVENTION

Accordingly, the present invention is directed to a stocker driving system and a stocker driving method using the same that substantially obviate one or more problems due to limitations and disadvantages of the related art. In general, the present invention achieves this by having normally manually operated input/output ports that may be commanded to operate automatically to accommodate a sudden increase in the number of items to be stocked, or to serve as a backup if an automatic input or output port malfunctions.

An advantage of the present invention is that it reduces bottlenecks that may occur in manufacturing.

Another advantage of the present invention is that it improves the robustness of a stocking system by enabling otherwise manually operated components to be switched to automatic operation to provide backup if an automatic component fails.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

The aforementioned and other advantages of the present invention are achieved with a stocker driving system, which comprises a stocker; a plurality of first ports disposed at the stocker, wherein the first ports are configured to operate automatically; a second port disposed at the stocker, the second port having a mode conversion controller for switching the second port between a manual and an automatic operation; a transfer vehicle line; a plurality of input/output controllers, wherein each of the plurality of first ports and the second port, are connected to a corresponding input/output controller; and a stocker master controller having a signal connection to the plurality of input/output controllers, the stocker, and the transfer vehicle line.

In another aspect of the present invention, the aforementioned and other advantages are achieved by a method for driving a stocker, wherein the method comprises sending an automatic guided vehicle port signal to a manual guided vehicle port, in response to an event; converting the manual guided vehicle port to a converted automatic guided vehicle port; and operating the converted automatic guided vehicle port in conjunction with a plurality of automatic guided vehicle ports.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or like parts.

Figure 1:
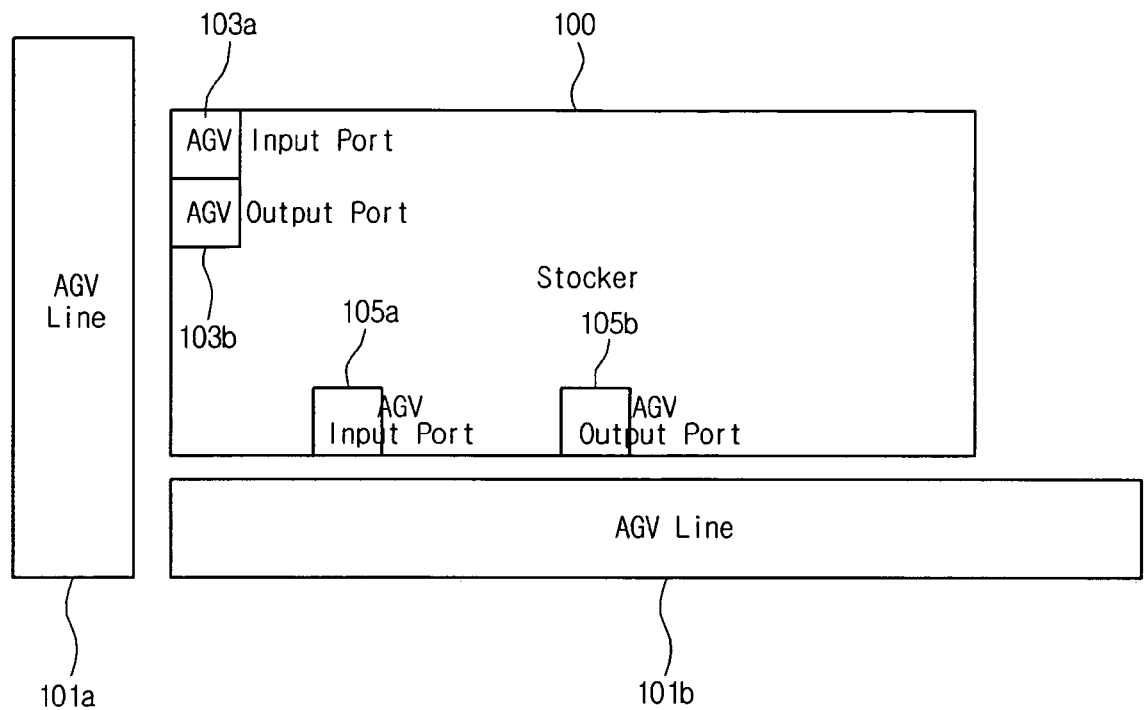
FIG. 1 illustrates a stocker according to the related art, in which a cassette is transferred through an AGV input/output port of a cassette stocker.
Figure 2:
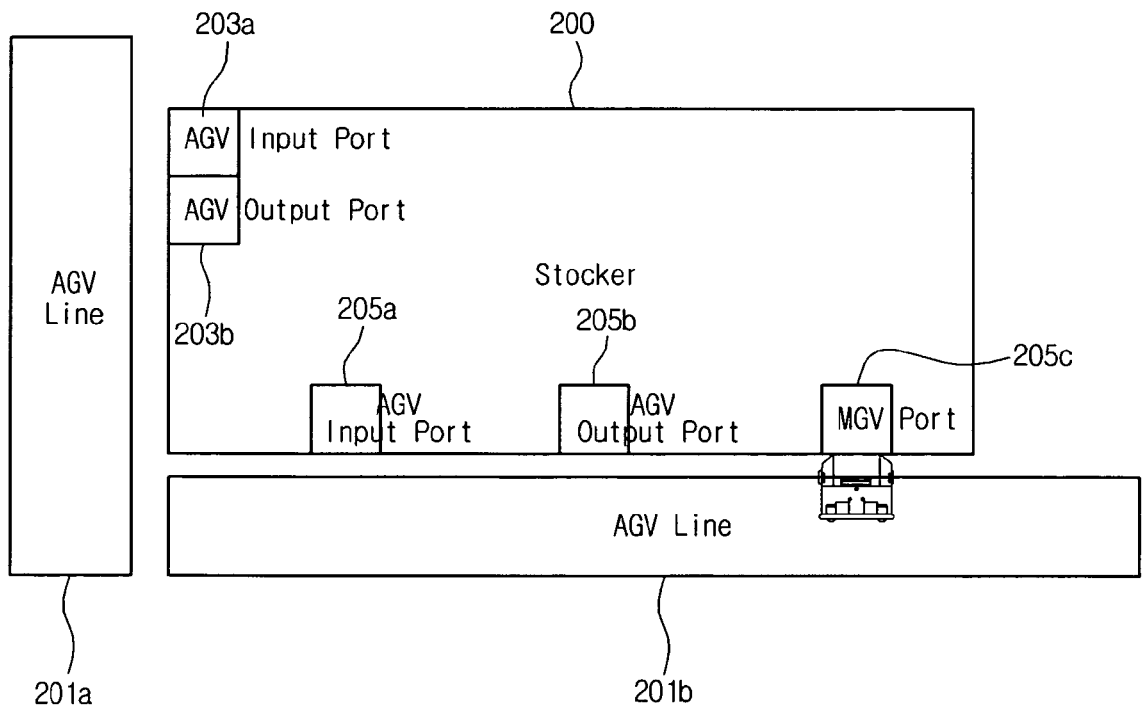
FIG. 2 illustrates a stocker in which a cassette is input/output to/from a cassette stocker to a manually guided vehicle (MGV) port according to the present invention.

FIG. 2 illustrates an exemplary stocker 200 in which a cassette is input/output from a cassette stocker to a manually guided vehicle (MGV) port according to the present invention. As illustrated in FIG. 2, stocker 200 includes automatic guided vehicle (AGV) input ports 203a and 205a respectively corresponding to AGV lines 201a and 201b, and AGV output ports 203b and 205b respectively corresponding to AGV lines 201a and 201b. AGV lines 201a and 201b, and their respective input and output ports, are located on different sides of stocker 200 for keeping the cassettes on which substrates are loaded.

The exemplary stocker 200 further includes an MGV port 205c for manually or automatically inputting/outputting cassettes to/from one side of the stocker 200.

In the present invention, the AGV input ports 203a, 205a, and the MGV port 205c accept cassettes into the stocker 200 from AGVs moving along the AGV lines 201a or 201b; and ACG output ports 203b, 205b, and the MGV port 205c output cassettes from the stocker 200 to ADVs moving along AGV lines 210a and 210b.

When the cassettes enter the AGV input port 203a of one side region, the stocker 200 moves the cassettes to the AGV output port 203b of a next region or to the AGV output port 205b of the other side region. However, if the cassettes to be transferred along the AGV lines 201a and 201b suddenly increase in quantity, the MGV port 205c can be converted to be an AGV port mode to automatically input/output the cassettes.

Accordingly, the MGV port 205c, which is normally operated manually in the stocker 200 can be operated in a manner substantially similar to the AGV ports 203a, 203b, 205a and 205b such that the stocker 200 can appropriately handle an increased production load.

The MGV port 205c can be allowed to complement a cassette input/output work as the AGV port at any time such that, when the stocker 200 is required to momentarily move many cassettes, the MGV port 205c can promptly participate in the cassette input/output work to prevent a bottleneck in the production line.

Figure 3:
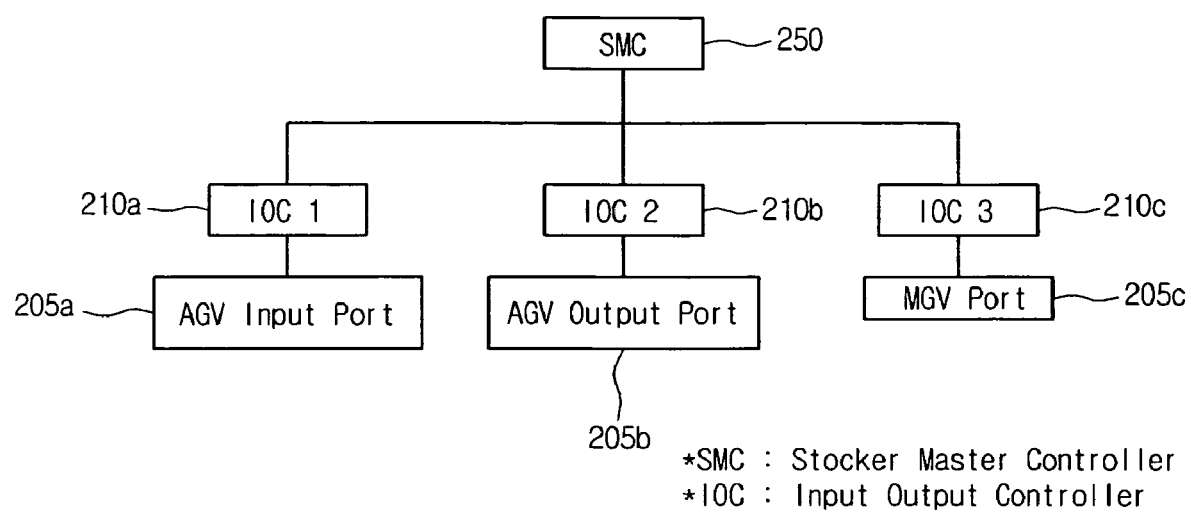
FIG. 3 illustrates a control architecture by which an MGV port is driven together with an AGV port according to the present invention.

FIG. 3 illustrates an exemplary control architecture by which an MGV port is driven together with an AGV port according to the present invention. Referring to FIG. 3, the AGV ports 205a and 205b along the AGV line 201b and the MGV port 205c are operated by a cassette transfer command of a stocker master controller (SMC) 250.

Accordingly, the SMC 250 commands input/output (IO) controllers 210a, 210b and 210c respectively corresponding to the AGV ports 205a and 205b and the MGV port 205c to input/output the cassette to/from the stocker 200. The IO controllers 210a, 210b and 210c command the AGV input/output ports 205a and 205b corresponding to the AGV line 201b and the MGV port 205c to input/output the cassettes. The SMC has signal connections to the each of the IO controllers, which are connected to the ports.

The MGV port 205c additionally has substantially similar software and hardware as the AGV ports 205a and 205b so that it can be converted to and operated in the AGV port mode or in a MGV port mode through a simple switching operation.

For example, when the MGV port 205c operates in the AGV port mode, it may operate under an X-axis control signal, a Y-axis control signal and a turn-axis control signal depending on the SMC 250 and the IO controller 210c. In other words, when the MGV port 205c is converted to operate in AGV port mode, it operates in the same manner as the AGV ports 205a and 205b. When the MGV port 205c returns to be in the MGV port mode, the AGV reverts to manual control, and X-axis control, Y-axis control and turn-axis control becomes manually activated.

Figure 4:
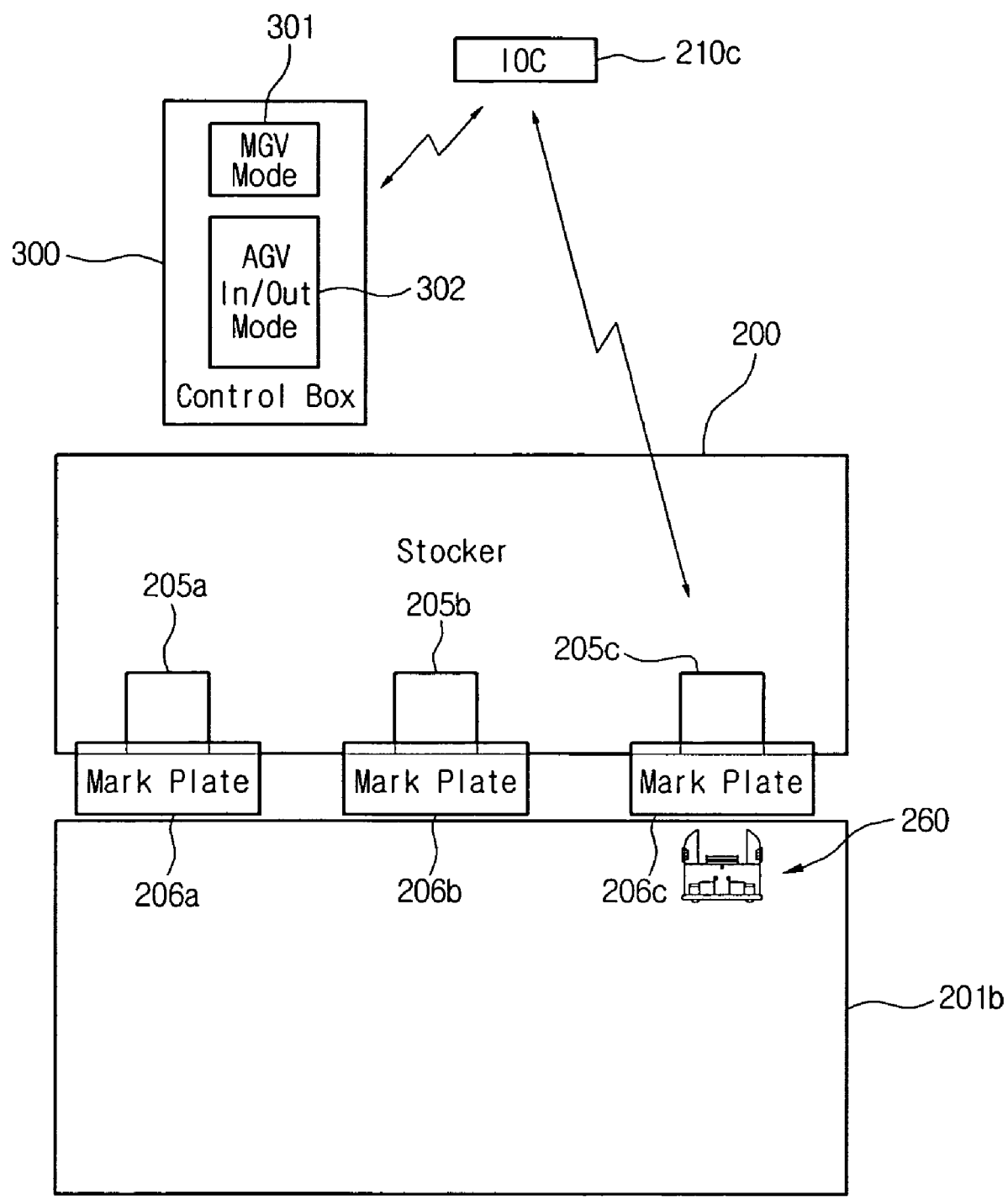
FIG. 4 illustrates a system in which a MGV port operates as an AGV port according to the present invention.

FIG. 4 illustrates an exemplary system in which the MGV port operates as the AGV port according to the present invention.

As illustrated in FIG. 4, the MGV port 205c receives an AGV control signal, and inputs/outputs the cassettes to/from the stocker 200. The MGV port 205c has a controller 300 for converting the MGV port mode 301 to the AGV port mode 302 and vice versa. When the MGV port 205c is converted to be in the AGV port mode 302 under the control of the controller 300, the IO controller 210c commands the MGV port 205c to input/output the cassettes.

When the MGV port 205c is switched to AGV mode, it can receive a control signal of the SMC from the IO controller 210c. Therefore, the MGV port 205c can operate as the AGV port does.

Accordingly, in the stocker 200, the MGV port 205c can input/output the cassettes to/from the AGV moving along the AGV line 201b, depending on the control signal of the IO controller 210c.

Mark plates 206a and 206b are disposed at regions corresponding to the AGV ports 205a and 205b. Accordingly, when the AGV 260 moves along the AGV line 201b, it detects the mark plates 206a and 206b to perform the input/output work at the corresponding AGV ports 205a and 205b.

In the same manner, when the MGV port 205c operates as the AGV port, the AGV 260 moving along the AGV line 201b can also detect a mark plate 206c to perform the input/output work at the corresponding MGV port 205c.

Accordingly, when the controller 300 converts to the MGV port mode 301 or the AGV port mode 302, the MGV port 205c operates manually or automatically, respectively. When the MGV port 205c operates automatically, it performs substantially similar operations as the AGV ports 205a and 205b. Since the present invention can operate the MGV port 205c in substantially the same manner as the AGV ports 205a and 205b, it can effectively contribute to processing when the quantity of the cassettes are suddenly increased.

Further, if one of the AGV ports 205a or 205b is down, the MGV port 205c can operate as an input/output port of the stocker 200. Therefore, equipment can be used effectively.

Furthermore, the MGV port can be converted and used as the AGV port in the existing stocker without special modification of the equipment. Therefore, a cost of additional equipment installation is mitigated.

As described above, the present invention has an effect in that the normally manually operated MGV port can be driven as the AGV port according to need, thereby appropriately responding to when the amount of cassette input/output is momentarily increased on the production line.

Further, the present invention has an advantage in that when any one of the AGV port is disabled, the MGV port complements the disabled AGV port, thereby smoothly operating the production line.

Although the system, as described, has two AGV input ports, two AGV output ports, a convertible MGV input/output port, and two AGV lines, it will be readily apparent to one of ordinary skill that other combinations of AGV and MGV ports are possible and within the scope of the invention. It will also be apparent that the systems as described may be expanded in a modular fashion to be suited for manufacturing facilities of different sizes. Further, although the systems as described pertain to the manufacture of LCDs, it will be apparent that the present invention may be applied to the manufacture of other products, in which the manufacturing process involves multiple steps and partially completed items need to be temporarily stored.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

Figure 5:
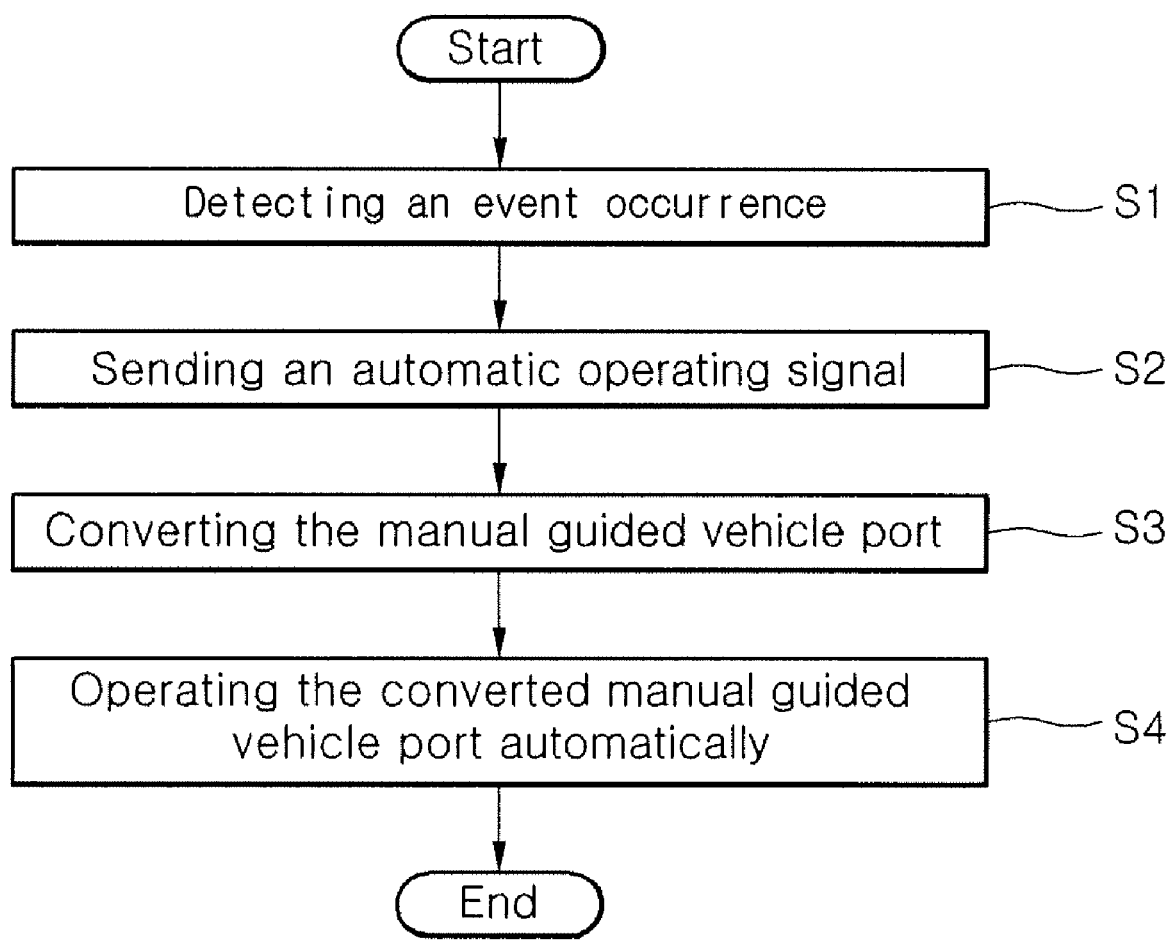
FIG. 5 illustrates a flow chart for a MGV port according to the present invention.

FIG. 5 illustrates a flow chart for a MGV port according to the present invention.

As illustrated in FIG. 5, a method for driving the stocker is operated by the cassette transfer command of the stocker master controller.

Detecting an event occurrence S1, when the event occur, sending an automatic operation signal to the manual guided vehicle port in response to the event S2, converting the manual guided vehicle port to the automatic operation mode S3, operating the converted manual guided vehicle port automatically in conjunction with plurality of automatic guided vehicle ports S4.

The event includes a sudden increase in a quantity of units to be stocked and a malfunction of one of the plurality of automatic guided vehicle ports.

What is claimed is:

1. A method for driving a stocker which includes a plurality of automatic guided vehicle ports disposed along a transfer vehicle line on one side region of the stocker, a manual guided vehicle port disposed along the transfer vehicle line on other side region of the stocker, comprising:
   sending an automatic operation signal to a manual guided vehicle port in response to an event;
   converting the manual guided vehicle port to the automatic operation mode; and
   operating the converted manual guided vehicle port automatically in conjunction with the plurality of automatic guided vehicle ports,
   wherein the units to be stocked include cassettes containing a plurality of liquid crystal display panels, and
   wherein the event includes a sudden increase in a quantity of units to be stocked.

2. The method according to claim 1, wherein the event includes a malfunction of one of the plurality of automatic guided vehicle ports.

3. The method according to claim 1, wherein operating the converted manual guided vehicle port includes inputting cassettes into the stocker via the converted manual guided vehicle port.

4. The method according to claim 1, wherein operating the converted manual guided vehicle port includes outputting cassettes from the stocker via the converted manual guided vehicle port.

5. The method according to claim 1, wherein operating the converted manual guided vehicle port includes controlling an X-axis, a Y-axis and a turn-axis of the converted manual guided vehicle port.

* * * * *